United States Patent [19]
Aharon et al.

[11] Patent Number: 5,724,504
[45] Date of Patent: Mar. 3, 1998

[54] METHOD FOR MEASURING ARCHITECTURAL TEST COVERAGE FOR DESIGN VERIFICATION AND BUILDING CONFORMAL TEST

[75] Inventors: Aharon Aharon, Doar Na Misgav, Israel; Laurent Fournier, South Burlington, Vt.; Alon Gluska, Kiriat Yam, Israel; Yossi Lichtenstein, Ramat-Gan, Israel; Yossi Malka, Haifa, Israel

[73] Assignee: International Business Machines Corporation, Armonk, N.Y.

[21] Appl. No.: 457,903

[22] Filed: Jun. 1, 1995

[51] Int. Cl.$^6$ .............................. G06F 11/00; G06G 7/48
[52] U.S. Cl. .................... 395/183.09; 364/489; 364/578
[58] Field of Search .................... 371/16.1, 22.1, 371/22.3, 22.4, 23, 24, 25.1, 26, 28, 29.1; 364/488, 489, 578, 570, 83.04, 400, 480; 395/183.01, 183.04, 183.06, 183.08, 183.09

[56] References Cited

U.S. PATENT DOCUMENTS

| | | | |
|---|---|---|---|
| 4,597,080 | 6/1986 | Thatte et al. | 371/25.1 |
| 4,811,345 | 3/1989 | Johnson . | |
| 4,862,399 | 8/1989 | Freeman | 371/27 |
| 4,937,765 | 6/1990 | Shupe et al. | 371/25.1 |
| 4,965,743 | 10/1990 | Malin et al. | 364/513 |
| 5,263,149 | 11/1993 | Winlow | 395/500 |
| 5,353,243 | 10/1994 | Read et al. | 364/528 |
| 5,526,277 | 6/1996 | Dangelo | 364/489 |
| 5,537,580 | 7/1996 | Giomi | 395/500 |
| 5,541,849 | 7/1996 | Rostoker | 364/489 |
| 5,541,861 | 7/1996 | Komoda | 364/578 |
| 5,544,067 | 8/1996 | Rostoker | 364/489 |
| 5,546,562 | 8/1996 | Patel | 395/500 |
| 5,548,539 | 8/1996 | Vlach | 364/578 |
| 5,553,002 | 9/1996 | Dangelo | 364/489 |
| 5,555,201 | 9/1996 | Dangelo | 364/489 |
| 5,557,531 | 9/1996 | Rostoker | 364/489 |
| 5,559,715 | 9/1996 | Misheloff | 364/488 |
| 5,604,895 | 2/1997 | Raimi | 395/500 |

*Primary Examiner*—Albert De'cady
*Attorney, Agent, or Firm*—Whitham, Curtis, Whitham & McGinn; Howard J. Walter

[57] ABSTRACT

A technique that applies the task coverage exercised within a behavioral model of the design to the design itself, while simulating one or more test sequences. Since the behavior model is an accurate and complete program representation of the architectural specification of the hardware design, the test case coverage of the architecture is implied by the measurement of how well the behavioral model code has been exercised. The completeness of the coverage is determined by the test coverage criteria selected, including, for example, statement coverage, branch coverage, or path coverage. The more detailed the criteria, the greater the number of tests.

8 Claims, 3 Drawing Sheets

METHOD FOR MEASURING ARCHITECTURAL TEST COVERAGE FOR DESIGN VERIFICATION AND BUILDING CONFORMAL TEST

BACKGROUND OF THE INVENTION

1. Field of the Invention

The present invention generally relates to hardware design verification, and, more particularly, to a technique that applies the task coverage exercised within a behavioral model of the design to the design itself, while simulating test sequences.

2. Description of the Related Art

The goal of hardware design verification is to ensure equivalence of the design and its architectural specification. This goal can be achieved either by formal proof or exhaustive simulation. However, state of the art formal techniques and the complexity of designs renders the formal approach incomplete for large industrial applications. Moreover, exhaustive simulation is impractical as the test space is very large.

In practice, design verification is carried out by simulating a small subset of selected test programs. These are run through the design simulation model, and the results are compared with the output predicted by the architecture simulation model.

One of the problems associated with this design verification process is the lack of appropriate measurable criteria for the quality of the test sets. Coarse measurements are used, but are of relatively little effect for the following reasons: (1) The number of tests, the number of simulation cycles, or similar quantities do not measure quality. As the full space of tests is quite large, only small fractions of possible tests (or cycles) can be simulated; (2) Test coverage on the implementation (e.g. the VHDL design files) does not guarantee compliance with the architecture. In particular, omissions of functions required in the architecture cannot be detected; and (3) Statistical quality control gives only a coarse estimate of the verification process. Moreover, statistical quality control does not supply detailed data on the parts of the architecture and design that need better testing.

The problem is compounded by the fact that modern hardware designs, such as microprocessors, have complex architectures. Typically, the processors include hundreds of instructions, several dozen resources, and complex functional units. A typical architecture description may be several hundred pages in length.

Architecture verification plans are written in an effort to measure quality. These documents list the different functions of the architecture (and design) and the way to test them. The progress of the verification process is then measured or tracked relative to these documents by marking the entries after a test is completed.

There are problems, however, with the verification plans themselves. First, they are informal and are not directly connected to either the architecture or the design. Second, the verification plans are prone to human error, mainly omissions, leading to incomplete verification. Unfortunately, the verification plans also do not provide any means to detect the omissions.

Consequently, the design verification process may lack adequate quality control. One solution is to use a large number of tests to try and gain confidence in the quality of the design. The result is that design verification costs could be as much as one to two thirds of the price of developing the new hardware. For example, the verification of a RISC System/6000 processor required fifteen billion simulation cycles. The verification was conducted for more than a year using large design and simulation teams and employing hundreds of computers.

Another solution is to use a carefully selected set of tests that are believed to be sufficient. While the computational resources needed in such a case are small, the quality of the verification is strongly dependent on the expertise of the test writers.

Both types of functional verification are expensive. Extensive testing in accordance with the first solution requires expensive computational resources, although less human expertise and resources are needed. Small, carefully selected tests in accordance with the second solution are relatively inexpensive to simulate, but require expensive expert human resources.

In light of the foregoing, there exists a need for a method to evaluate the quality of hardware design verification from an architectural point of view. There also exists a need for quality functional verification methods that employ modest computational and human resources.

SUMMARY OF THE INVENTION

The present invention is directed to a procedure for measuring architectural test coverage for design verification which substantially obviates one or more of the problems due to the limitations and disadvantages of the related art.

This invention makes use of software analysis techniques that apply the task coverage exercised within a behavioral model of the design to the design itself, while simulating one or more test sequences. Since the behavior model is an accurate and complete program representation of the architectural specification of the microprocessor, the test case coverage of the architecture is implied by the measurement of how well the software model code has been exercised.

The completeness of the coverage is determined by the software analysis criteria selected (i.e., each conditional path of branch/select statements, dependent variable changes with each independent variable change, etc.) and this will determine the number of test cases required to provide full coverage. The more detailed the criteria, the greater the number of tests. This invention extends the use of software analysis techniques on the Behavioral Model Code to measure the coverage of the test cases with respect to the architectural definition for the hardware.

To achieve these and other advantages and in accordance with the purpose of the invention, as embodied and broadly described, the invention provides for a method of measuring architectural test coverage for hardware design verification, having a behavioral simulator model representing the architecture, the method comprising the steps of: (1) providing test coverage criteria; (2) generating multiple tasks to be measured; (3) executing one of a set of test cases on the behavioral simulator model to determine which of the multiple tasks are covered by the test case and which of the multiple tasks are not covered by the test case; (4) repeating the executing step for the multiple tasks not covered by the test case until all test cases in the set are executed; and (5) identifying all tasks of the behavioral circuit model that were covered by the test cases.

In another aspect, the invention further includes the step of identifying all test cases that cover any of the multiple tasks to produce a test set.

The proposed solution is confined to the architectural aspects of the design verification process. In fact, the solution is independent of the actual realization of the architecture, that is, only the design's behavior is accessible (it is considered a "black box"). The design verification process must also include methods that focus on the design details, that is, the so-called "white-box" testing of the design. In particular, aspects that are not specified in the architecture model, for example, pipeline performance, should be verified. Behaviors that are important because of their specific implementation should be tested separately.

The proposed solution is confined to hardware designs where software behavioral simulators and large numbers of tests are available. Hardware designs that are verified without a software behavioral simulator as a reference model are not suitable for the suggested methods. In cases where only a small number of tests are available, the usefulness of the disclosed methods is limited. Small, in this context, typically means hundreds or thousands.

While the detailed description refers to design verification for processors, the disclosed methods are applicable to any hardware design other than a processor that is verified with a behavioral simulator.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
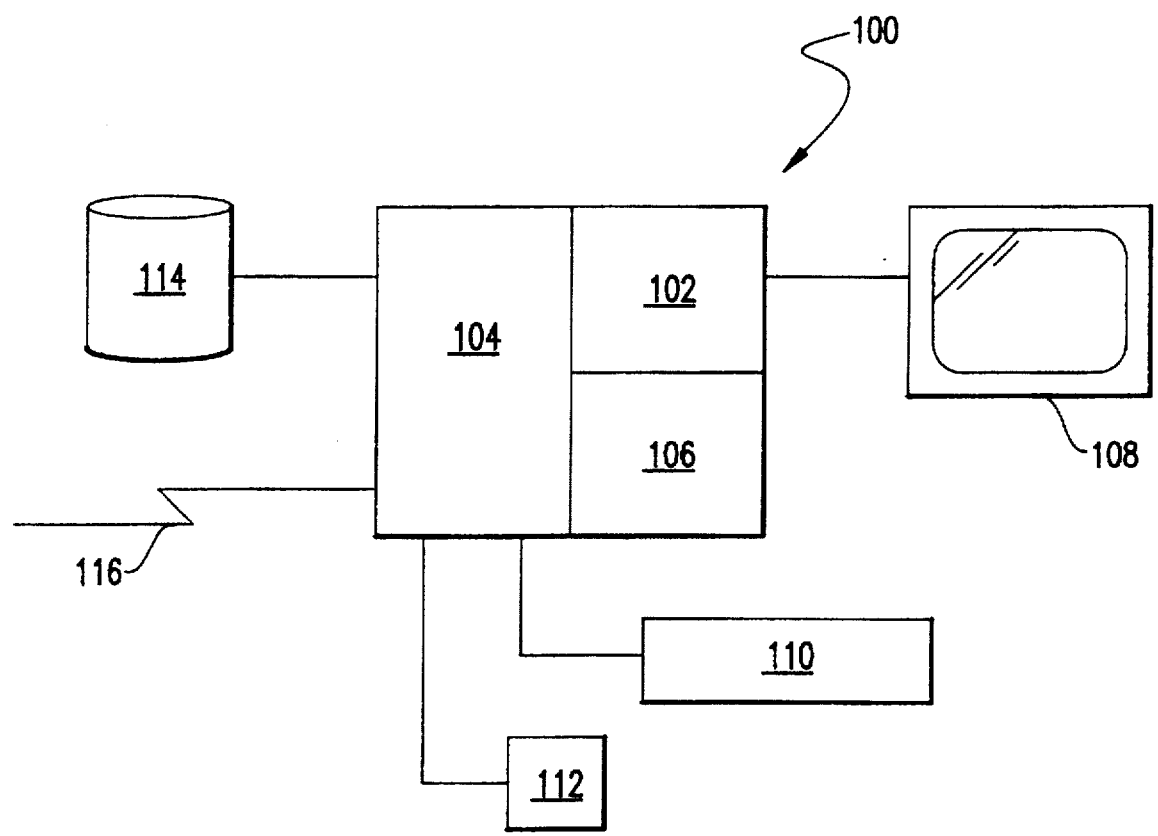
FIG. 1 illustrates a computer system that implements the process of the present invention.

The methods of the present invention, measuring architectural test coverage for hardware design verification, operate on a computer system such as that shown in FIG. 1. While FIG. 1 illustrates a personal computer embodiment, it is understood that the computer system can also be a workstation, minicomputer, or mainframe type of computer. The computer typically includes a system unit 100 which contains a processor or CPU 102 and memory 104. The design verification program 106 operates on the processor and is resident in memory 104. The system will typically have a display device 108 such as a color or monochrome CRT, a keyboard 110, a pointing device 112 such as a mouse or trackball, a fixed disk drive 114, and optionally, a network connection 116 to a LAN or other network.

A discussion of the various components of the method will now be described.

Behavioral Simulators

The basic rationale of the disclosed methods is that a behavioral simulator can be viewed as a formal, correct, and complete representation of the architecture. The reason is that in some verification processes the behavioral simulator is heavily used, debugged and tested early in the verification phase. The reason for such heavy reliance on simulators is that they are built to allow development of a software product to be run on the hardware, prior to completion of the design and the fabrication of the hardware itself. For example, operating systems are normally developed using behavioral simulators prior to the fabrication of the processors. Thus, the behavioral simulator becomes the de facto architecture specification as seen by the future users of the hardware.

Behavioral simulators are also used during the design verification to produce expected results for test cases. In this way, behavioral simulators are used as the architecture definition for verification purposes.

Behavioral simulators are relatively simple and concise. High level programming languages allow compact representation of the architecture. Typically, the size of a behavioral simulator, in terms of lines of code, is approximately one-tenth of a corresponding design. This allows relatively cost-efficient coverage evaluation.

Software Coverage Criteria

Assuming that a behavioral simulator is a representation of an architecture, the quality of the test sets may then be evaluated against the behavioral simulator. The present inventive procedure utilizes standard software coverage criteria for several reasons. One is that behavioral simulators are normally written in procedural programming languages, for example, C or C++. Also, tools for test coverage evaluation of programming languages are available. Moreover, there is a large amount of experience and research in evaluating the quality of software testing coverage criteria. For example, high coverage of the path criterion, discussed further below, is known to provide good testing of the code.

A key distinction, however, is that the above tools and experience consider the behavioral simulator code as an implementation. In the present invention, the behavior simulator code is a specification of the architecture rather than its implementation.

Test coverage is the primary concept behind systematic software testing. Testing can be described as a process in which a large input domain is partitioned into classes such that testing a single representative of a class is deemed adequate. The aim of any systematic testing technique is to partition the input domain in a formal, algorithmic, and possibly automatic manner. This is in contrast to less systematic testing practices in which the input partitioning is done heuristically, usually in an ad-hoc manner, and manually. The lack of formal specifications for most software projects forces these input partitions to be defined in terms of programs.

Test coverage, therefore, provides a way to induce a partitioning of the input domain from the program. The most basic software test coverage criteria is control flow coverage, in particular, statement coverage, branch coverage, and path coverage.

Statement coverage requires that each statement of the program under test be executed at least once. Similarly, branch coverage requires that tests exercise each branch in the program. For example, an IF(CONDITION) must be tested twice; once when the CONDITION is TRUE and again when the CONDITION is FALSE. For structured programs, a test suite that is adequate for branch coverage also satisfies statement coverage.

These statement and branch criteria have become the common minimal requirement for program testing. More sophisticated methods have been implemented in test coverage evaluators. Examples include evaluating the number of executions for each statement (rather than just zero/one marks per statement), and requiring that a branch be taken as a result of its multi-condition subterms.

Path coverage, still a control flow criterion, is much more comprehensive than branch coverage. It requires that each control path induced by the program be exercised. Program paths are induced by branches and loops and their numbers tend to grow exponentially with the size of the program. Achieving path coverage has been shown to be impractical for actual programs.

A second family of software coverage criteria is data flow coverage. For example, the definition/use criterion requires that each control path from a variable definition to the usage of this definition be exercised at least once. The number of data flow criteria has been shown to grow linearly with the size of the program. Data flow criteria have not yet been included in commercial test evaluation systems.

The third family of criteria stems from hardware production testing and is called mutation coverage. A mutation is a syntactical alteration of the program under test such as the replacement of a plus sign with a minus sign in an arithmetic expression. When a test that is fed to both the original and mutated programs produces different results, the mutation is considered covered by the test.

Large sets of mutations representing common faults introduced by programmers have been defined for some programming languages (e.g., Fortran and C). Applying all possible single-mutations to a small program results in thousands of mutations.

Coverage Tasks

When a specific coverage criteria is considered for a specific program, the result is a set of Coverage Tasks that should be evaluated. Consider, for example, the following illustrative program:

L1: if P1 then S1
L2: else S2
L3: if P2 then S3
L4: else S4 where L1–L4 are statement labels, P1 and P2 are inputs, and S1–S4 are actions the program does. When the coverage criterion "statement coverage" is required for this program, four coverage tasks are to be evaluated:

coverage task-1: L1 is executed by a test
coverage task-1: L2 is executed by a test
coverage task-1: L3 is executed by a test
coverage task-1: L4 is executed by a test A test set that covers these four coverage tasks may be:

test-1: P1=true P2=true
test-2: P1=false P2=false

In this example each test covers two coverage tasks. Test-1 covers coverage tasks 1 and 3 and test-2 covers tasks 2 and 4. Other test sets may provide full statement coverage for the example program, that is, cover all coverage tasks, but all of them must include at least two tests.

Consider the situation when the program has not been tested at all. Here, the coverage is empty and all four coverage tasks are non-covered. When test-1 is executed, it contributes to the coverage—tasks 1 and 3 are removed from the list of non-covered tasks and only tasks 2 and 4 are considered non-covered. When test-2 is executed, it also contributes to the coverage—tasks 2 and 4 are removed from the list of non-covered tasks and this list becomes empty.

If a third test is executed at this stage (e.g. P1=true P2=false), it does not contribute to the coverage because it does not remove any non-covered tasks. Note that in this example there are no more non-covered tasks to be removed, so any subsequent test would not contribute to the coverage. It may also be the case that non-covered tasks still remain, but a test does not remove any of them.

When the coverage criterion "path coverage" is required for the above illustrative program, four coverage tasks are to be evaluated:

coverage task-1: L1 and L3 are executed by the same test
coverage task-1: L1 and L4 are executed by the same test
coverage task-1: L2 and L3 are executed by the same test
coverage task-1: L2 and L4 are executed by the same test A test set that covers these four coverage tasks may be:

test-1: P1=true P2=true
test-2: P1=true P2=false
test-3: P1=false P2=true
test-4: P1=false P2=false Four tests are needed for the path criterion, that is, to cover the last coverage tasks. Each of the tests covers only one coverage task. For example, test-2 covers task-2. No smaller test-set can cover all paths in the example program. For the two inputs defined (P1 and P2) the above test is exhaustive since it exercises all the combinations of inputs. Note that the path criterion is more demanding than the statement criterion.

As an illustration, consider for example a very simple architecture containing two types of instructions:

op1 flag11 flag12 input1 output1
op2 flag21 flag22 input2 output2 where the flags are boolean, and the inputs and outputs are of the same (unspecified) type. A design (i.e., an implementation or realization of the architecture) conforms if all sequences of instruction instances produce correct results. Results are considered correct if the (unspecified) machine state produced by the design is the same as the one predicted by a behavioral simulator.

To keep the following example simple, it is assumed that the instructions have no side effects (i.e., an instruction changes only its output) and that the outputs are dependent only on the flag values. Thus each of the actions (S1, S2, S3, S4, R1, R2) is a non-conditional manipulation of the input and it produces the output. The strings L0, L1, L2, M1, M2, M3, M4, N0, N1, and N2 are statement labels:

```
MAIN (test)
while (test is not empty)
L0: read from test (op, flag1, flag2, input, output)
L1: if (op = op1) call function1 (flag1, flag2, input, output)
L2: if (op = op2) call function2 (flag1, flag2, input, output)
end while
end MAIN
FUNCTION1 (flag1, flag2, input, output)
M1: if (flag1) do S1
M2: else do S2
M3: if (flag2) do S3
M4: else do S4
end FUNCTION1
FUNCTION2 (flag1, flag2, input, output)
N0:
N1: if (flag1) do R1
N2: if (flag2) do R2
end FUNCTION2
```

The following are examples of requirements from a verification plan and their interpretation as coverage criteria of different parts of the behavioral simulator:

Test each of the instructions at least once. This can be interpreted as statement coverage on MAIN, that is, covering the following statements: L0, L1, L2.

Test that sequences of two instructions are correct. This can be interpreted as path (of length 3) coverage on MAIN, that is, cover the following paths: L0, L1, L2; L0, L2, L1; L0, L1, L1; and L0, L2, L2

Test all the values of op1 flags. This can be interpreted as statement coverage on FUNCTION1, that is, covering the following statements: M1, M2, M3, M4.

Test all the combinations of op1 flags. This can be interpreted as path coverage on FUNCTION1, that is, covering the following paths: M1 M3, M1 M4, M2 M3, M2 M4.

Test all the values of op1 and op2 flags. This can be interpreted as statement coverage on FUNCTION1, that is, covering the following statements: M1, M2, M3, M4, N1, N2.

Test all combinations of op1 flags and separately of op2 flags. This can be interpreted as path coverage on FUNCTION1 and FUNCTION2, that is, covering the following paths: M1 M3, M1 M4, M2 M3, M2 M4, N0, N0 N1, N0 N2, N0 N1 N2.

Test all combinations of op1 flags and op2 flags. This can be interpreted as path coverage on FUNCTION1 and on FUNCTION2 when seen as a single graph, that is, covering the following paths:

M1 M3 N0
M1 M3 N0 N1
M1 M3 N0 N2
M1 M3 N0 N1 N2
M1 M4 N0
M1 M4 N0 N1
M1 M4 N0 N2
M1 M4 N0 N1 N2

Test sequences of two instructions with all combinations of op1 flags and op2 flags. This can be interpreted as path coverage on MAIN, FUNCTION1, and FUNCTION2 when seen as a single graph, that is, covering the following paths:

L0 L1 M1 M3 L2 N0
L0 L1 M1 M3 L2 N0 N1
L0 L1 M1 M3 L2 N0 N2
L0 L1 M1 M3 L2 N0 N1 N2
L0 L2 N0 L1 M1 M3
L0 L2 N0 N1 L1 M1 M3
L0 L2 N0 N2 L1 M1 M3
L0 L2 N0 N1 N2 L1 M1 M3

To conclude, this example demonstrates how standard verification tasks are mapped to coverage requirements on different parts of the behavioral simulator.

Architecture Conformance (AC) and Architecture Conformance Test-Set (ACT)

The process of the present invention measures the quality of the verification from an architectural standpoint by evaluating test cases with respect to software coverage criteria on the behavioral simulator. Given sets of test cases, it also builds architecture conformance test-sets according to the disclosed measures. These procedures give well-defined architecture conformance measures and build relatively small test sets. It allows good quality functional verification with modest computational and human resources.

The first method of the invention (FIG. 2) measures the Architecture Conformance (AC), which is a detailed report containing the covered and non-covered tasks. The input set of tests (T), including multiple individual tests (t), is evaluated with respect to an architecture represented by a behavioral simulator (BS) and a set of software test coverage criteria (C). The output is an Architecture Conformance (AC) measure.

Figure 2:
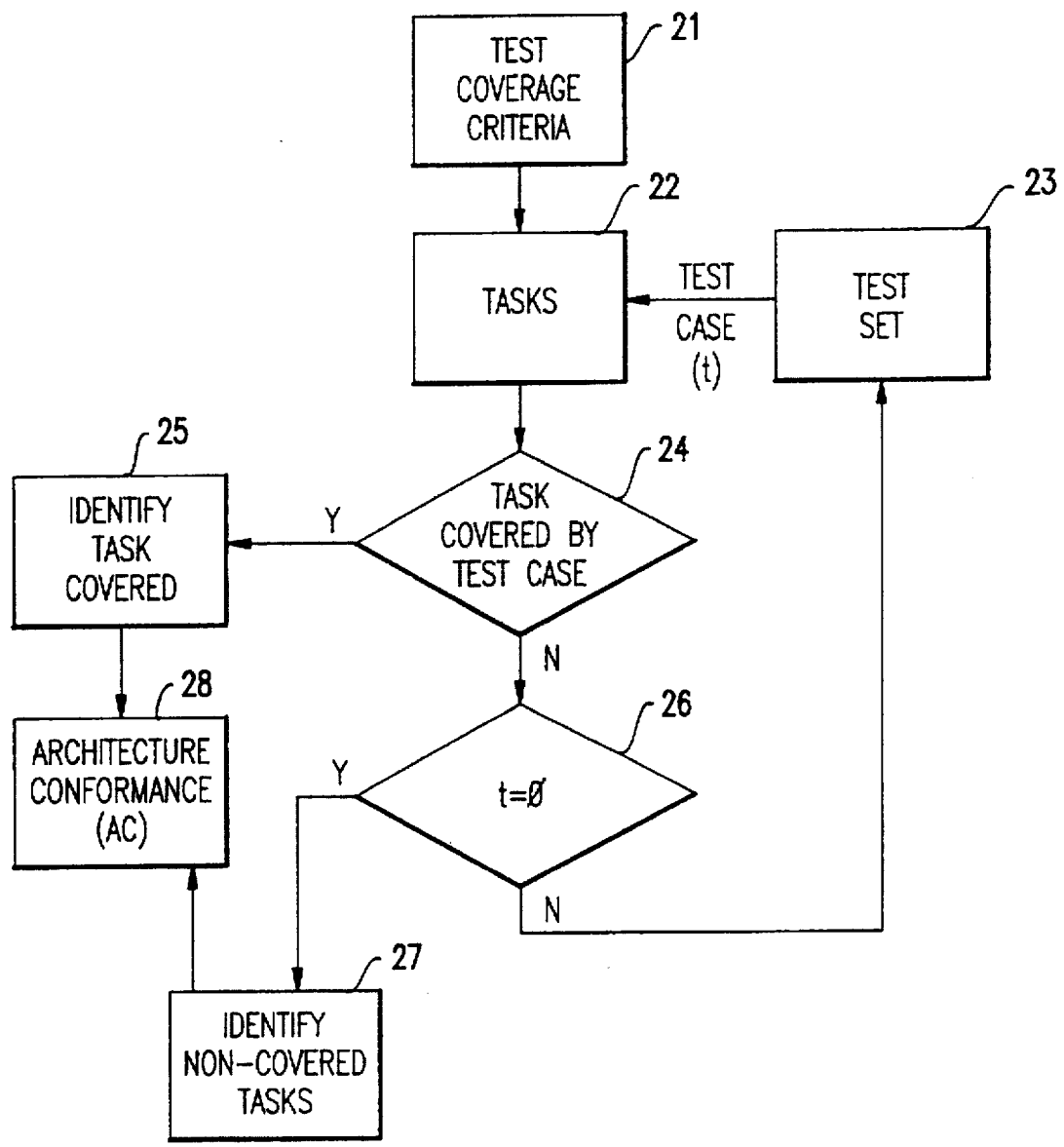
FIG. 2 provides a flow chart of one method of the present invention.

The following is a free style flow of the method:
1. Coverage: =empty
2. Non-Covered-Tasks: =produced from BS and C
3. Choose t in T; T: =T-t
4. Execute t on BS
5. New-Coverage: =Non-Covered-Tasks which are covered during step (3)
6. Coverage: =Coverage+New-Coverage
7. Non-Covered-Tasks: =Non-Covered-Task-New-Coverage
8. If Non-Covered-Tasks and T are not empty go-to step (3)
9. (else) AC=(Coverage, Non-Covered-Tasks)
10. Terminate The free style flow is generally depicted in FIG. 2. The tasks 22 are generated from the test coverage criteria 21 and the behavioral simulator. A test case (t) from test set 23 is then executed on the tasks 22. In decision block 24, any tasks that are covered by the test case (t) are identified 25 and become part of the Architecture Conformance (AC) report 28. Additional test cases (t) are executed on the remaining non-covered tasks in block 22, with tests contributing to the coverage being identified 25 with each test sequence, until all test cases in the test set 23 have been executed 26. After all the test cases are executed, the non-covered tasks remaining in block 22 are identified 27, and become part of the Architecture Conformance (AC) report 28. In the alternative, all of the tasks 22 may be covered before all of the test cases (t) are executed. In that case, there will be no non-covered tasks in the AC.

In the second method of the present invention (FIG. 3), an Architecture Conformance Test-Set (ACT) is produced. Using a set of test cases (T), a behavioral simulator (BS), and a set of software test coverage criteria (C) as inputs, an ACT is produced as follows:

1. Each test (t) of the test set is given as input (i.e., a stimuli) to the behavioral simulator.
2. While the behavioral simulator is executing a test, coverage is recorded. The coverage tasks, resulting from the behavioral simulator code and the coverage criteria, are evaluated with respect to this test.
3. A test that contributes to the coverage is included in the ACT. Such a test is one that covers a task previously non-covered. Tests that do not contribute to the coverage are not included in the ACT.

Figure 3:
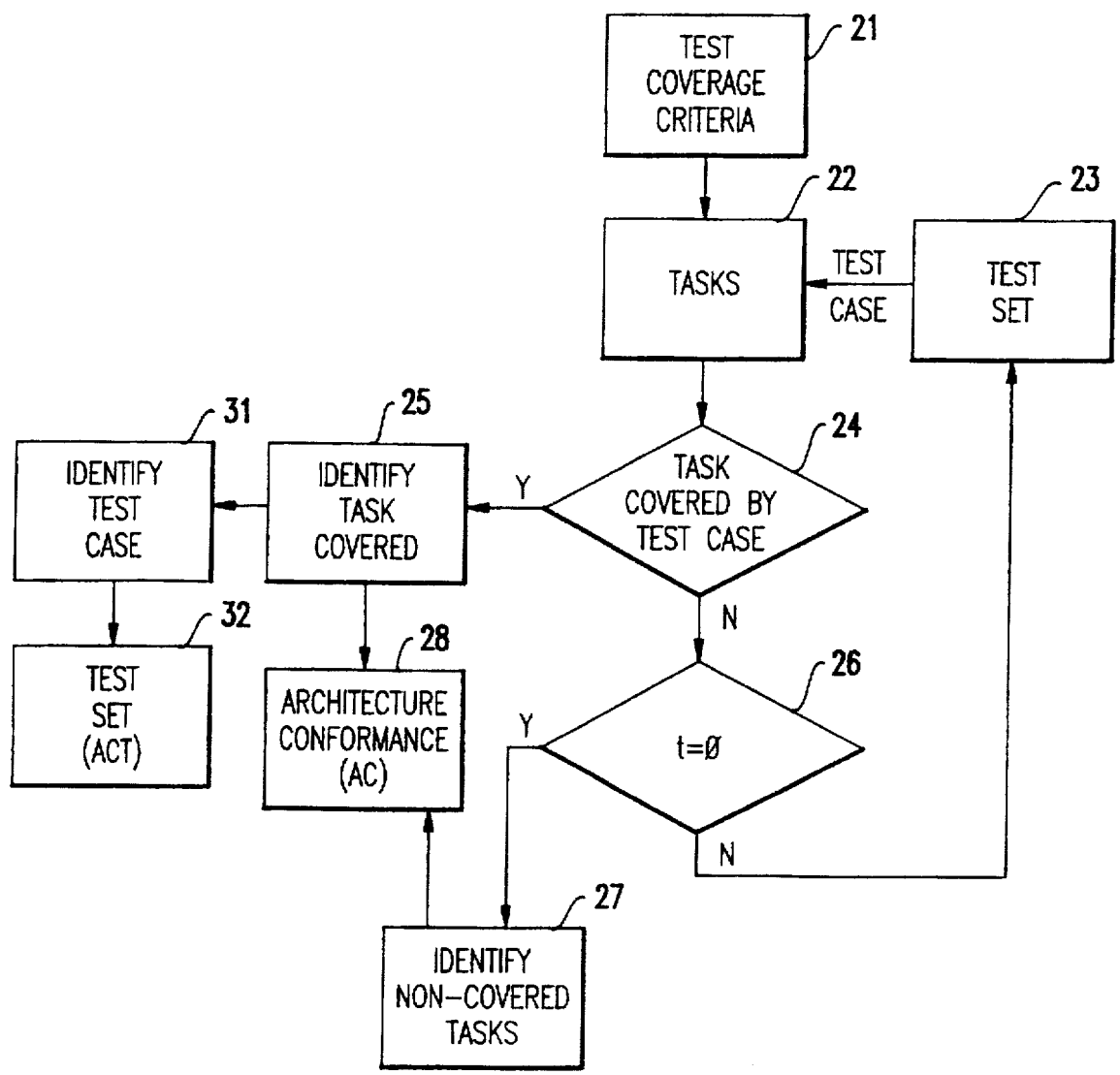
FIG. 3 provides a flow chart of a second method of the present invention.

As an illustration, the following is free style control flow of the method:
1. ACT: =empty
2. Non-Covered-Tasks: =produced from BS and C
3. Choose t in T; T: =T-t
4. Execute t on BS
5. New-Coverage: =Non-Covered-Tasks which are covered during step (3)
6. If New-Coverage is not empty ACT: =ACT+t
7. Non-Covered-Tasks: =Non-Covered-Task-New-Coverage
8. If Non-Covered-Tasks and T are not empty go-to step (3)
9. (else) Terminate The free style flow is generally depicted in FIG. 3. The method is essentially the same as that discussed with regard to FIG. 2, with like reference numbers referring to the same functions. The difference is that after a covered task is identified in block 25, the test case (t) covering the task is also identified 31. All of the test cases (t) that contribute to coverage are then grouped together to form an Architecture Conformance Test-Set (ACT) 32 for future use.

The above methods are useful when large numbers of tests are used in the verification process. The second method— building an ACT—is essentially a way to prefer high-coverage tests over low-coverage ones and it is not needed when the number of tests is small. The first method—measuring AC—is useful even if the number of tests is not large.

The Architecture Conformance Test-Set obtained by the second method has the following characteristics:

1. It is a set of tests which guarantee a well-defined level of testing of the design under verification.

2. The method is independent of the specific design architecture, design, and test format. Thus, the same architecture conformance test-set can be applied to designs implemented in various ways, languages, and environments. Any design verification process that uses a behavioral simulator will be able to use the method.

3. By using basic software criteria, the size of the test sets can be kept relatively small. For example, for a PowerPC processor (PowerPC is a trademark of IBM Corporation) evaluated using branch coverage, the ACT contains a few thousand tests.

4. Smaller ACTs that are built with basic coverage criteria are ideal for regression sets. These are tested frequently to ensure that small changes to the design have not changed its architectural behavior.

5. ACTs can be defined for different levels of quality and size. Using basic coverage criteria gives small sets; using more rigorous coverage criteria increases the set size and enhances quality. In general, the complexity of the coverage criteria controls the size and quality of the resulting ACTs.

6. ACTs are uniform with respect to the architecture; there is no biasing towards particular functions of the architecture. ACTs are dependent only on the behavioral simulator and coverage criteria; when the behavioral simulator covers the architecture uniformly, so will the resulting ACTs.

7. ACTs are best suited for single instruction testing during processor verification. However, selecting different coverage criteria can also test sequences of instructions. By requiring high complexity coverage criteria (e.g., the path criterion described above) on parts of the simulator that control the execution of the instructions, coverage of sequences may be achieved.

8. The method of the present invention leaves the implementor freedom to use any type of tests. For example, many simple tests can achieve similar coverage as a smaller number of more complex tests. However, the observability of test results may be the reason to choose simpler tests.

9. The resulting ACT depends on the order the tests are chosen (step 3 in the method control flow). Order-independent ACTs can be obtained by an expensive variation of the disclosed method.

The disclosed methods thus provide a formal and automatic process for achieving coverage and quality from an architectural standpoint, as opposed to the informal and manual processes of the prior art. In addition, human errors (or omissions) inherent in the manual process are eliminated.

The invention analytically measures the test set coverage against the behavioral model which represents the architectural specification in program format. This reduces the number of tests required and focuses the expert human resources on the areas lacking coverage. It ensures high quality in the verification process while providing a cost effective solution.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A computer-implemented method of generating test vectors for hardware design verification, having a behavioral simulator model representing an architecture corresponding to the hardware design, the method comprising the steps of:

generating said behavioral simulator model, said model comprising a plurality of conditional branch statements and logical function statements conditional thereon;

generating a set of test input cases corresponding to said behavioral simulator model;

receiving and storing a test coverage criteria, said test coverage criteria establishing a criteria which an execution of a sub-plurality of said conditional branch statements and of said function statements must meet to constitute an execution of said behavioral simulator model;

generating a plurality of logical coverage tasks, each of said logical coverage tasks having an executable sub-plurality of said conditional branch statements and said logical function statements, and each of said plurality of tasks being in accordance with said received test coverage criteria;

for each test input case in said set of test input cases, selecting the test input case and executing the selected test input case on the behavioral simulator model;

determining which of said plurality of logical coverage tasks are executed by each test input case executed on the behavioral simulator model; and identifying all of the logical coverage tasks of the behavioral simulator model that were not executed by the test input cases, based on a repeating of said determining step for each test input case.

2. A method as in claim 1 wherein the test coverage criteria is one or more of statement coverage, branch coverage, and path coverage.

3. A method as in claim 1, wherein the test coverage criteria is data flow coverage.

4. A method as in claim 1, wherein the test coverage criteria is mutation coverage.

5. A method according to claim 1, further including the steps of:

identifying all test input cases that cause execution cover any of the plurality of logical coverage tasks; and generating a reduced set of test input cases based on the test input cases identified by said identifying step.

6. A programmable computer operable for performing a method of measuring architectural test coverage for hardware design verification, wherein a behavioral simulator model represents an architecture corresponding to the hardware design, comprising:

means for generating said behavioral simulator model, said model comprising a plurality of conditional branch statements and logical function statements conditional thereon;

means for generating a set of test input cases corresponding to said behavioral simulator model;

means for receiving and storing a test coverage criteria, said test coverage criteria establishing a criteria which an execution of a sub-plurality of said conditional branch statements and of said function statements must meet to constitute an execution of said behavioral simulator model;

means for generating a plurality of logical tasks, each of said logical tasks having an executable sub-plurality of said conditional branch statements and said logical function statements, and each of said plurality of tasks being in accordance with said received test coverage criteria means for selecting each test input case in said set of test input cases and executing said selected test input case on the behavioral simulator model;

means for determining which of said plurality of logical coverage tasks are executed by each test input case executed on the behavioral simulator model; and means for identifying all of said input test cases that cause execution of any of the plurality of tasks based on an output of said means for determining; and means for producing a reduced test set consisting of all of the test input cases that cause execution of any of the plurality of tasks, based on an output of said means for identifying.

7. A computer-implemented method of generating test vectors for hardware design verification, having a behavioral simulator model representing an architecture corresponding to the hardware design, comprising the steps of:

generating said behavioral simulator model, said model comprising a plurality of conditional branch statements and logical function statements conditional thereon;

generating a set of test input cases corresponding to said behavioral simulator model;

receiving and storing a test coverage criteria, said test coverage criteria establishing a criteria which an execution of a sub-plurality of said conditional branch statements and of said function statements must meet to constitute an execution of said behavioral simulator model;

generating a plurality of logical coverage tasks, each of said logical coverage tasks having an executable sub-plurality of said conditional branch statements and said logical function statements, and each of said plurality of tasks being in accordance with said received test coverage criteria;

initializing all of said logical coverage tasks to a condition of having not been executed; and repeating the steps of
  (1) selecting a test input case and executing the selected test input case on the behavioral simulator model, and
  (2) determining whether any of said plurality of logical coverage tasks are executed by the selected test input case for a first time subsequent to said initializing step and, if any are so executed for a first time, determining which of the test input cases are so executed, until all of said plurality of logical coverage tasks are executed or all of said test input cases are selected and executed, whichever occurs first.

8. A method according to claim 7, further comprising the step of identifying all of said plurality of test input cases which cause any of said plurality of logical coverage tasks to be executed for a first time, based on said determining step.

* * * * *